(12) United States Patent
Beyly et al.

(10) Patent No.: US 8,704,797 B2
(45) Date of Patent: Apr. 22, 2014

(54) CAPACITIVE TOUCH PAD CONFIGURED FOR PROXIMITY DETECTION

(75) Inventors: Laurent Beyly, Peynier (FR); Cyril Troise, Marseilles (FR); Maxime Teissier, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 160 days.

(21) Appl. No.: 13/309,284

(22) Filed: Dec. 1, 2011

(65) Prior Publication Data
US 2012/0139870 A1  Jun. 7, 2012

(30) Foreign Application Priority Data

Dec. 1, 2010  (FR) ...................................... 10 04665

(51) Int. Cl.
*G06F 3/038* (2013.01)
*G09G 5/00* (2006.01)

(52) U.S. Cl.
USPC .......................... 345/174; 345/173; 178/18.06

(58) Field of Classification Search
USPC ......... 345/173, 174; 178/18.01, 18.03, 18.04, 178/18.06
See application file for complete search history.

(56) References Cited

U.S. PATENT DOCUMENTS

| | | | |
|---|---|---|---|
| 6,452,514 B1 * | 9/2002 | Philipp | 341/33 |
| 6,466,036 B1 | 10/2002 | Philipp | 324/678 |
| 2006/0250142 A1 * | 11/2006 | Abe | 324/663 |
| 2007/0062739 A1 * | 3/2007 | Philipp et al. | 178/18.06 |
| 2008/0246723 A1 | 10/2008 | Baumbach | 345/156 |
| 2010/0042346 A1 | 2/2010 | Kuang | 702/65 |
| 2010/0181180 A1 | 7/2010 | Peter | 200/5 R |
| 2010/0295559 A1 | 11/2010 | Osoinach | 324/658 |
| 2010/0302202 A1 * | 12/2010 | Takeuchi et al. | 345/174 |
| 2011/0120784 A1 * | 5/2011 | Osoinach et al. | 178/18.06 |
| 2011/0234528 A1 * | 9/2011 | Guedon et al. | 345/174 |
| 2012/0050211 A1 * | 3/2012 | King et al. | 345/174 |
| 2012/0113051 A1 * | 5/2012 | Bird et al. | 345/174 |

FOREIGN PATENT DOCUMENTS

| | | |
|---|---|---|
| EP | 0680006 A1 | 11/1995 |
| EP | 1593988 A1 | 11/2005 |
| EP | 1848111 A2 | 10/2007 |

* cited by examiner

*Primary Examiner* — William Boddie
*Assistant Examiner* — Amy C Onyekaba
(74) *Attorney, Agent, or Firm* — Seed IP Law Group PLLC

(57) ABSTRACT

The present disclosure relates to a method for controlling a touch pad, comprising an object locate mode for locating an object on the touch pad comprising steps of: determining a measurement of capacitance of each of the pairs of electrodes of the touch pad, each pair comprising a row electrode and a column electrode transverse to the row electrode, comparing each measurement with a first detection threshold, and if the comparison of at least one measurement with the first threshold reveals the presence of an object on the touch pad, locating the object on the touch pad according to the capacitance measurements, the method comprising a proximity detection mode comprising steps of: determining a measurement representative of the capacitance between one or two electrodes and one or two other electrodes of the touch pad, and comparing a measurement obtained with a second detection threshold different from the first threshold.

32 Claims, 5 Drawing Sheets

CAPACITIVE TOUCH PAD CONFIGURED FOR PROXIMITY DETECTION

BACKGROUND

1. Technical Field

The present disclosure relates to a method for detecting an object by means of a detection signal supplied by a capacitive touch pad-type proximity sensor. The present disclosure applies mainly, but not exclusively, to capacitive touch pads implementing a charge transfer technique.

2. Description of the Related Art

Such a touch pad is widely used for example in man/machine interfaces for inputting system data and commands. Therefore, such a touch pad is designed to detect and locate a finger of the user on the touch pad, i.e., at a distance of less than a few millimeters from the latter. Some touch pads are transparent and are associated with a screen in devices such as mobile telephones.

FIG. 1 represents a touch pad TS comprising electrodes T1, ... Tp, R1, ... Rn having the form of bands, which include electrodes Ti (i being a whole number ranging between 1 and p) disposed in columns and electrodes Rj (j being a whole number ranging between 1 and n) disposed in rows transverse to the electrodes Ti. Generally, only one of the so-called "sending" electrodes is activated at a given instant, and so-called "receiving" electrodes are scanned one after the other or simultaneously to obtain measurements representative of the capacitance on each pair of electrodes comprising the active sending electrode and the scanned receiving electrode. The column electrodes Ti (or row electrodes Rj) are connected as sending electrodes, and the row electrodes Rj (or column electrodes Ti) are connected as receiving electrodes. Using the measurements obtained, the position of an object on the touch pad may be determined, given that the presence of an object on the touch pad can change the capacitance on pairs of electrodes located near the object.

Amongst the capacitance measurement methods suited to touch pads, there are particularly methods based on the measurement of a capacitor charge or discharge time, methods based on the use of a relaxation oscillator, and methods based on the charge transfer principle. The methods using a relaxation oscillator involve generating a signal having a frequency which varies according to the capacitance to be measured, then measuring the frequency of that signal. The methods based on charge transfer involve using a "sampling" capacitor, with a high capacitance compared to the capacitances to be measured, charging the capacitance to be measured, and transferring the charge of the capacitance to be measured into the sampling capacitor, and repeating these charge and transfer operations a certain number of cycles. Certain methods based on charge transfer involve executing a fixed number of charge and transfer cycles, and measuring the voltage at the terminals of the sampling capacitor, which is representative of the capacitance to be measured, at the end of the fixed number of cycles. Other methods based on charge transfer execute charge and transfer cycles until the voltage at the terminals of the sampling capacitor reaches a threshold voltage, the number of cycles thus executed being representative of the capacitance to be measured.

An example of implementation of the method based on charge transfer applied to a touch pad is described in U.S. Pat. No. 6,452,514. FIG. 1 represents a control circuit IOC of the touch pad TS, as described in U.S. Pat. No. 6,452,514. The circuit IOC comprises input/output ports P0, P1, ... Pn and output ports Pn+1 to Pn+p. Each input/output port Pj (j being a whole number ranging between 1 and n) is connected to a respective input/output stage of the circuit IOC. Each input/output stage comprises a switch I1 controlled by a signal S1, and a transistor M3 the gate of which is controlled by a signal S3. Each switch I1 comprises a terminal connected to a node common to other input/output stages and a terminal connected to the port Pj and to the drain of the transistor M3. The source of each transistor M3 is connected to the ground. Each output port Pn+i (i being a whole number ranging between 1 and p) is linked to a supply voltage source Vdd of the circuit through a transistor M2 the gate of which is controlled by a signal S2. The port P0 is connected to the drain of a transistor M5 the gate of which is controlled by a signal S5 and the source of which is grounded. The port P0 is also connected to a logic circuit LGC supplying the control signals S1, S2, S3, S5 of each input/output and output stage.

To control the electrodes T1-Tp and R1-Rn, the port P0 is connected to a terminal of a sampling capacitor (Cs) the other terminal of which is connected to the ground. The ports P1 to Pn are connected to the row electrodes R1-Rn, and the ports Pn+1 to Pn+p are connected to the column electrodes T1-Tp.

Each row electrode Rj is configured with each of the column electrodes Ti to generate a capacitance of which varies particularly according to the proximity of an object to an area in which the row electrode overlaps with the column electrode. The circuit LGC receives numbers (i, j) of a pair of ports to be analyzed Pn+i, Pj to locate an object on the touch pad TS, and supplies a measurement DT representative of the capacitance on the pair of electrodes Ti, Rj connected to the selected pair of ports Pn+i, Pj. The measurement representative of the capacitance on the electrode is obtained according to a number of cycles executed for charging the pair of electrodes and transferring the charge to the sampling capacitor Cs, and to the voltage at the terminals of the capacitor Cs after the number of cycles executed.

The logic circuit LGC manages the control circuit 10C that has just been described in accordance with a sequence of steps summarized in Table 1 below:

TABLE 1

| | Port | | | | |
| | P0 | Pj | | Pn + i | |
| Step | S5 | S1 | S3 | S2 | Description |
| --- | --- | --- | --- | --- | --- |
| 1 | 1 | 0 | 1 | 0 | Discharge of Cs and capacitance on Rj |
| 2 | 0 | 0 | 1 | 0 | Dead time |
| 3 | 0 | 1 | 0 | 1 | Connection of Cs to capacitance on Rj and capacitance on Ti to Vdd |
| 4 | 0 | 0 | 1 | 0 | Dead time |
| 5 | 0 | 0 | 1 | 0 | Capacitance on Rj to 0 |
| 6 | 0 | 0 | 1 | 0 | Dead time |
| 7 | 0 | 0 | 1 | 0 | Reading of the charge of Cs |

In Table 1 and below, i and j represent whole numbers varying from 1 to p, and from 1 to n, respectively.

The sequence of steps which comprises steps 1 to 7, is executed successively for each port Pj and each port Pn+i, and thus for each pair of electrodes (Ti, Rj) connected to the circuit 10C. During the execution of this sequence, all the switches I1 and transistors M2, M3 of the circuit IOC of which are not mentioned in Table 1, remain open or off. Step 1 is an initialization step during which the signals S3, S5 switch on the transistors M3, M5 connected to the ports P0 and Pj, to discharge the capacitor Cs and the selected electrode Rj. The next step 2 is a dead-time step during which all the transistors M2, M3, M5 are off and all the switches I1 are open. In step 3, the switch I1 connected to the port Pi is closed to enable a charge transfer between the capacitance on the electrode Rj and the capacitor Cs. In parallel, the transistor M2 connected to the port Pn+i is switched on to charge the capacitance on the electrode Ti to the supply voltage Vdd. The result is a charge transfer between the capacitance on the electrode Rj and the capacitor Cs. The next step 4 is a dead-time step, identical to step 2. In the next step 5, the transistor M3 connected to the port Pj is switched on to discharge the capacitance on the electrode Rj. The next step 6 is a dead-time step, identical to step 2. In the next step 7, all the switches I1 remain open and only the transistor M3 connected to the port Pj is switched on. The voltage of the port P0, corresponding to the voltage of the capacitor Cs, is then measured.

The execution of steps 3 to 6 is repeated a certain fixed number of cycles. After executing this number of cycles, the voltage of the port P0 is measured. The presence and the position of an object on the touch pad TS is then determined according to the measurements obtained for each pair of electrodes Ti, Rj. In practice, a finger of a user can only be detected and located on the touch pad TS if it is less than a few millimeters from an overlapping area of the electrodes of a pair of electrodes (Ti, Rj).

It can be useful to integrate a proximity detector into a system such as a mobile telephone, integrating a touch pad of the type described previously, to activate or deactivate the system or more generally, to activate or deactivate some functions of the system. Thus, the proximity detector may be used to detect when the user moves his hand or a finger to a distance of a few centimeters from the system. For example, control keyboard backlighting may be activated when the user moves his hand toward the keyboard. A proximity detector may also be integrated into a mobile telephone to lock a touch-sensitive keyboard and/or put a screen into low-energy mode during a telephone call, when the user moves the telephone close to his ear.

Generally, such a proximity detection is performed using a dedicated electrode, which is large in size similar to a contact-activatable touch pad electrode. In a mobile telephone, such a proximity detection electrode may be disposed around the keyboard and/or the screen. Due to its large dimensions, it may be difficult to integrate such an electrode into a small system. Adding such an electrode also requires providing a dedicated detector circuit, connected to the electrode to produce a proximity detection function based on a signal supplied by the electrode. Therefore, integrating a proximity detection function into a system contributes to increasing the dimensions, the cost and the current consumption of the system.

It can therefore be desirable to add a proximity detection function into a system comprising a capacitive touch pad, without increasing the size, the cost and the current consumption of the system.

BRIEF SUMMARY

Some embodiments relate to a method for controlling a touch pad, the method comprising an object locate mode for locating an object on the touch pad comprising steps of: determining a measurement representative of the capacitance on each of a plurality of pairs of electrodes of the touch pad, each pair of electrodes comprising a row electrode and a column electrode transverse to the row electrode, comparing each measurement with a first detection threshold defined to detect the presence of an object on the touch pad, and if the comparison of at least one measurement with the first detection threshold reveals the presence of an object on the touch pad, determining the position of the object on the touch pad according to the capacitance measurements. According to one embodiment, the method comprises a proximity detection mode for detecting an object near the touch pad, the proximity detection mode comprising steps of determining a measurement representative of the capacitance between one or two electrodes and one or two other electrodes of the touch pad, and determining the presence of an object near the touch pad by comparing a measurement obtained in proximity detection mode with a second detection threshold defined for the proximity detection mode, different from the first detection threshold.

According to one embodiment, in proximity detection mode, the presence of an object near the touch pad is detected using the measurement representative of the capacitance on a single pair of electrodes comprising a row electrode and a column electrode transverse to the row electrode.

According to one embodiment, in proximity detection mode, the presence of an object near the touch pad is detected using the measurement representative of the capacitance on four pairs of electrodes each located on an edge of the touch pad.

According to one embodiment, the measurement representative of the capacitance on the four pairs of electrodes is taken in one, or in two or four successive measurements.

According to one embodiment, in proximity detection mode, the presence of an object near the touch pad is detected using the measurement representative of the capacitance on a single pair of parallel electrodes each located on an edge of the touch pad.

According to one embodiment, in proximity detection mode, the presence of an object near the touch pad is detected using the measurement representative of the capacitance between a first central electrode of the touch pad and two other electrodes parallel to the first electrode and each located on an edge of the touch pad.

According to one embodiment, the measurement representative of the capacitance on the two pairs of electrodes is taken in one or in two successive measurements.

According to one embodiment, each measurement representative of the capacitance of a pair of electrodes of the touch pad comprises steps of: executing several cycles of charging the capacitance on the pair of electrodes and transferring the charge from the pair of electrodes to a sampling capacitor, and determining the measurement representative of the capacitance on the pair of electrodes according to the number of charge and transfer cycles, so that the voltage at the terminals of the sampling capacitor reaches a threshold voltage, or according to the voltage at the terminals of the sampling capacitor, after a fixed number of charge and transfer cycles.

According to one embodiment, each measurement representative of the capacitance on a pair of electrodes of the touch pad comprises steps of:

(a) applying a first voltage to a first terminal of a sampling capacitor and a second intermediate voltage in between the first voltage and a third voltage greater than or equal to a ground voltage, to the second terminal of the sampling capacitor, (b) applying the third voltage to a first electrode of the pair of electrodes, and the second voltage to the second electrode of the pair of electrodes, (c) linking the first electrode to the first terminal of the sampling capacitor and applying the second voltage to the second electrode and to the second terminal of the sampling capacitor, to transfer electric charges between the electrodes and the sampling capacitor, and (d) executing several cycles each comprising steps (b) and (c), the measurement representative of the capacitance between the first and the second electrode being determined according to the voltage at a terminal of the sampling capacitor the other terminal of which receives the third voltage, after executing a fixed number of cycles, or according to the number of cycles executed so that the voltage at a terminal of the sampling capacitor reaches a threshold voltage.

According to one embodiment, the first voltage is equal to a supply voltage and/or the second voltage is in the order of the first voltage divided by two, and/or the third voltage is equal to the ground voltage.

According to one embodiment, the proximity detection mode uses a sampling capacitor having a higher capacitance than that of the sampling capacitor used in locate mode.

Some embodiments also relate to a device for managing a touch pad comprising a plurality of electrodes disposed in rows and in columns transverse to the rows, the device being configured to implement the method defined above.

According to one embodiment, the device comprises an input/output circuit comprising: a first port connected to a terminal of a sampling capacitor another terminal of which is connected to the ground, a first group of ports each connected to a respective electrode of the touch pad, linked to the first port through a first switch unit and linked to the ground through a second switch unit, a second group of ports each connected to a respective electrode of the touch pad and each linked to a power source of the circuit through a third switch unit, and a control circuit configured for controlling the switch units and for supplying, using voltage measurements at a terminal of the sampling capacitor, measurements representative of the capacitance of pairs of electrodes comprising one electrode connected to a port of the first group of ports and one electrode connected to a port of the second group of ports.

According to one embodiment, the device comprises an input/output circuit comprising two groups of ports each linked to a node common to the group of ports through a switch unit, and a control circuit, the first group of ports comprising a first port receiving a voltage lower than a supply voltage of the circuit, several ports each connected to a respective electrode of the touch pad, and a port connected to a first terminal of a sampling capacitor and linked to the ground through a switch unit, the second group of ports comprising a port connected to a second terminal of the sampling capacitor and linked to a power source through a switch unit, and several ports each connected to a respective electrode of the touch pad and each linked to the ground through a switch unit, and the control circuit being configured for controlling the switch units and for supplying, using voltage measurements at a terminal of the sampling capacitor, measurements representative of the capacitance on pairs of electrodes comprising one electrode connected to a port of the first group of ports and one electrode connected to a port of the second group of ports.

According to one embodiment, the input/output circuit comprises at least three groups of ports each linked to a common node through a respective switch unit controlled by the control circuit, one port of a group of ports being connected to a terminal of several sampling capacitors, another terminal of each sampling capacitor being connected to a port of another respective group of ports.

According to one embodiment, the control circuit is configured for controlling the switch units so as to execute several cycles of charging a capacitance on a pair of electrodes, of transferring the charge between the pair of electrodes and the sampling capacitor, and of comparing with a threshold the voltage at a terminal of the sampling capacitor until the compared voltage reaches the threshold, the capacitance to be measured being determined according to the number of cycles executed.

According to one embodiment, the control circuit is configured for controlling the switch units so as to execute a fixed number of cycles of charging the capacitance on a pair of electrodes, and of transferring the charge between the pair of electrodes and the sampling capacitor, and for measuring the voltage at a terminal of the sampling capacitor, the capacitance to be measured being determined according to the voltage measured.

BRIEF DESCRIPTION OF THE SEVERAL VIEWS OF THE DRAWINGS

Some embodiments also relate to a processor comprising a device such as the one defined above.

Some examples of embodiments of the present disclosure will be described below in relation with, but not limited to, the following figures, in which.

DETAILED DESCRIPTION

Figure 2:
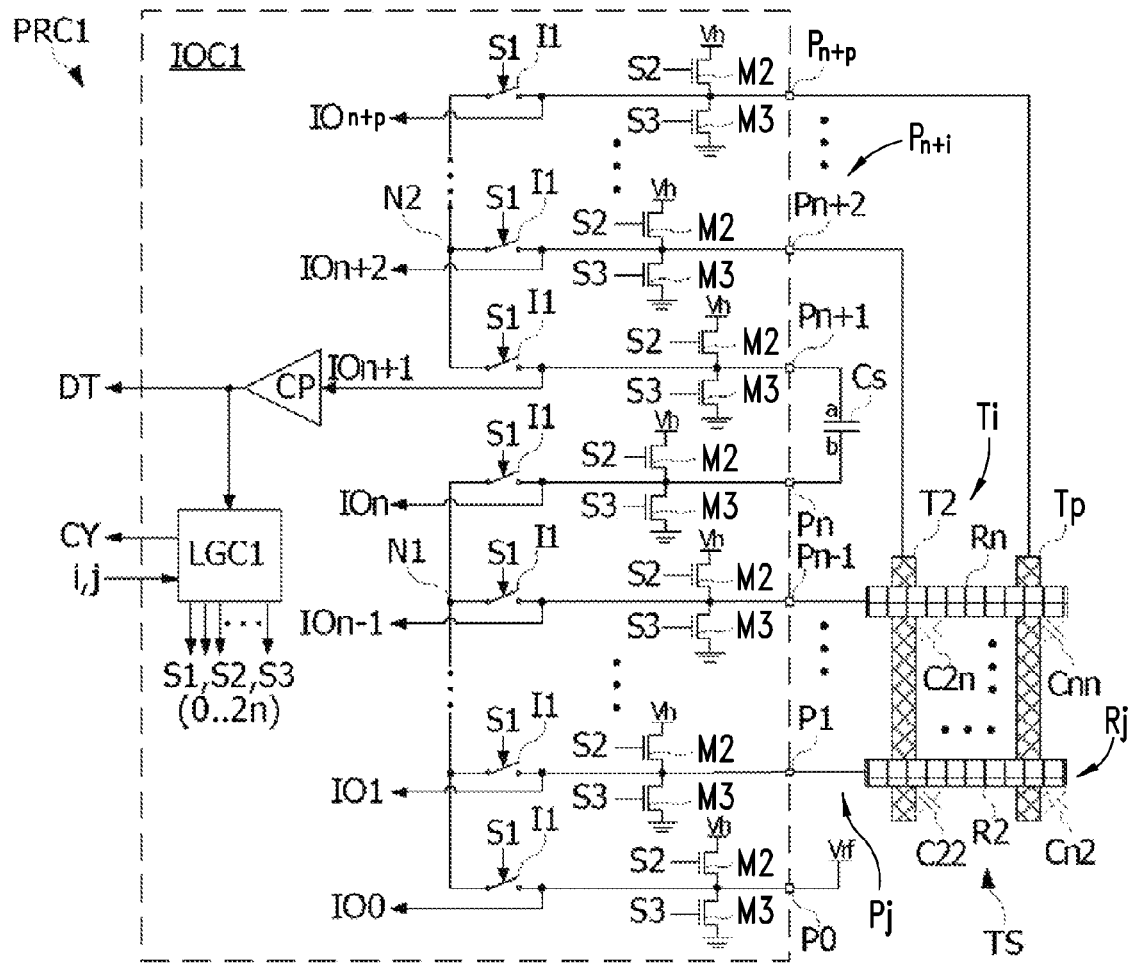
FIG. 2 represents a touch pad control circuit, according to one embodiment.

FIG. 2 represents a control circuit IOC1 of a touch pad, according to one embodiment. The circuit IOC1 is for example integrated into a processor PRC. The processor PRC is for example of microcontroller type. The circuit IOC1 comprises n+p+1 input/output ports P0, P1, . . . Pn+p of the processor PRC. Each port Pi (i being a whole number ranging between 0 to n+p) is connected to a respective input/output stage of the circuit IOC1. Each input/output stage comprises a switch I1 controlled by a signal S1, and two transistors M2, M3 the gates of which are controlled respectively by signals S2, S3. The switch I1 comprises a terminal connected to a node common to other input/output stages and a terminal connected to the port Pi, to the source of the transistor M2, and to the drain of the transistor M3. The drain of the transistor M2 receives a voltage Vh which can be the supply voltage of the circuit, and the source of the transistor M3 is connected to the ground. The circuit IOC1 comprises two groups of input/output stages each comprising a common node N1, N2, the switches I1 of the ports P0 to Pn being connected to a first common node N1, and the switches I1 of the ports Pn+1 to Pn+p being connected to a second common node N2, not linked to the common node N1. In addition, at least one of the ports, for example the port Pn+1, is connected to an output IOn+1 connected to the input of a comparator CP. The output of the comparator CP is connected to a logic circuit LGC1 supplying the control signals S1, S2, S3 of each input/output stage. Each of the other ports P0 to Pn+p may also be connected to an output IO0 to IOn+p connected to a comparator (not represented) which may be identical to the comparator CP and the output of which is connected to the circuit LGC1.

According to one embodiment, to control electrodes T2-Tp and R2-Rn of the touch pad TS so as to detect the position of an object on the touch pad, one of the ports connected to a comparator, for example the port Pn+1 connected to the comparator CP, is connected to a terminal a of a sampling capacitor Cs the other terminal b of which is connected to a port of the other group of input/output stages, for example the port Pn. Therefore, whatever the status of the switches I1, the terminals of the capacitor Cs cannot be short-circuited. Furthermore, the port P0 for example, receives a reference voltage Vrf lower than the voltage Vh, for example the voltage Vh divided by 2, and the other ports are each connected to an electrode Ti, Rj. In the example in FIG. 2, the ports P1 to Pn−1 are connected to the row electrodes R2-Rn, and the ports Pn+2 to Pn+p are connected to the column electrodes T2-Tp. It shall be noted that it is not necessary for the number of row electrodes to be equal to the number of column electrodes.

The row electrodes Rj form, together with the column electrodes Ti, capacitors C22, . . . Cnn the capacitance of which varies particularly according to the proximity of an object. The comparator CP supplies the circuit LGC1 with a detection signal DT. The circuit LGC1 receives a pair of numbers of ports to be analyzed Pi, Pj to detect the presence of an object on the touch pad TS, and supplies a number of cycles CY that was necessary to discharge the capacitor Cs below a certain threshold detected by the comparator CP. This threshold is for example in the order of Vh/3.

In practice, the electrodes may have narrower sections in the vicinity of the areas of overlapping with the transverse electrodes, and enlarged sections in the areas between the overlapping areas.

The logic circuit LGC1 manages the control circuit IOC1 that has just been described in accordance with a sequence of steps summarized in Table 2 below:

TABLE 2

| | Port | | | | | | | |
|---|---|---|---|---|---|---|---|---|
| | Pn + i | | Pn + 1 | | Pn | | Pj − 1 | P0 |
| Step | S1 | S3 | S1 | S2 | S1 | S3 | S1 | S1 | Description |
| 1 | 0 | 0 | 0 | 1 | 1 | 0 | 0 | 1 | Charge of Cs between Vh and Vrf |
| 2 | 0 | 0 | 0 | 0 | 0 | 0 | 0 | 0 | Dead time |
| 3 | 0 | 1 | 0 | 0 | 0 | 0 | 1 | 1 | Charge of Cij between 0 and Vrf |
| 4 | 0 | 0 | 0 | 0 | 0 | 0 | 0 | 0 | Dead time |
| 5 | 1 | 0 | 1 | 0 | 1 | 0 | 1 | 1 | Charge transfer between Cij and Cs |
| 6 | 0 | 0 | 0 | 0 | 0 | 0 | 0 | 0 | Dead time |
| 7 | 0 | 0 | 0 | 0 | 0 | 1 | 0 | 0 | Reading of the charge of Cs |

In Table 2 and below, i and j represent whole numbers ranging between 2 and p, and between 2 and n, respectively.

The sequence of steps which comprises steps 1 to 7, is executed successively for each port Pn+i and each port Pj−1, and therefore for each pair of electrodes (Ti, Rj) connected to the circuit IOC1. During the execution of this sequence, all the switches I1 and the transistors M2, M3 of the circuit IOC1, the control signals S1, S2, S3 of which are not mentioned in Table 2, remain open or off. In step 1, the switch I1 of the stage connected to the port Pn is closed, while the signal S2 switches on the transistor M2 connected to the port Pn+1, and the signal S1 closes the switch I1 connected to the port P0. Therefore, the terminals a and b of the capacitor Cs are respectively connected to Vh and Vrf, to charge the capacitor Cs to the supply voltage minus the reference voltage (Vh− Vrf). The next step 2 is a dead-time step during which all the transistors M2, M3 are off and the switches I1 are open. In step 3, the capacitor Cij formed by the electrodes Ti and Rj is charged to Vrf. For this purpose, the transistor M3 connected to the port Pn+i is switched on using the corresponding signal S3 to put the electrode Ti to the ground. In parallel, the switches I1 connected to the port Pj−1 and to the port P0 are open to put the electrode Rj to the voltage Vrf. The next step 4 is a dead-time step, identical to step 2. In the next step 5, the switches I1 connected to the ports Pn+j, Pn+1, Pn, Pj−1 and P0 are closed simultaneously to transfer electric charges between the terminals of the capacitor Cs and the capacitance on the electrodes Ti, Rj. Therefore, the terminal a of the capacitor Cs is linked to the electrode Ti which was put to the ground in step 3, and the terminal b of the capacitor Cs is linked to the electrode Rj which was put to the voltage Vrf in step 3. Furthermore, the terminal b of the capacitor Cs is put to the voltage Vrf. The capacitor Cs is thus discharged in the capacitor Cij formed by the electrodes Ti and Rj. The next step 6 is a dead-time step, identical to step 2. In the next step 7, the transistor M3 of the stage connected to the port Pn is switched on to put the terminal b of the capacitor Cs to the ground, so as to enable the voltage at the terminal a of the capacitor Cs to be read by the comparator CP.

The execution of steps 2 to 7 is then repeated a certain number of cycles until the signal at the input of the comparator CP, corresponding to the voltage at the terminals a and b of the transistor Cs, reaches a certain low threshold voltage value. The number of cycles of executing steps 2 to 7 varies according to the capacitance Cij between the electrodes Ti and Rj, and thus makes it possible to determine whether or not a finger of the user is near (at a distance of a few millimeters from) the overlapping area between the electrodes Ti and Rj. The dead-time steps 2, 4, 6 make sure that the switching actions of the switches I1 and of the transistors M1, M3 are completed before controlling other switching actions. The duration of these steps may be adapted to the switching characteristics (particularly switching time) of the transistors and of the switches, and to the characteristics of the control signals S1, S2, S3. When the voltage at the terminals of the capacitor Cs reaches the threshold voltage, the sequence of steps 1 to 7 is executed successively with the other pairs of electrodes Ti, Rj of the touch pad TS. The processor PRC may therefore determine the position of an object placed on the touch pad TS, if the number of cycles CY of executing steps 2 to 7 is greater or lower than a detection threshold value for one or more pairs of electrodes Ti, Rj.

It shall be noted that a measurement representative of the capacitance on each pair of electrodes of the touch pad TS may also be determined by setting the number of cycles of executing steps 2 to 7 for each pair of electrodes to a certain value, and by measuring the voltage of the capacitor Cs, i.e., the voltage of the port Pn+1 after executing the fixed number of cycles.

The capacitor Cs is selected so as to have a high capacitance compared to that of the capacitors Cij in the absence of excitation by the presence of an object. In practice, with a capacitor Cs of a few tens of nano-farads, the ratio between the capacitance of the capacitor Cs and that of the capacitance on each of the pairs of electrodes Ti, Rj corresponding to the gain of the device, can reach 1,000 to a few thousand. The number of cycles CY necessary for the voltage of the capacitor Cs to reach the threshold voltage is thus in the order of several hundred. The difference in the numbers of cycles CY obtained with a pair of electrodes Ti, Rj depending on whether the latter is excited or not by the presence of a finger may reach a few tens of cycles. It will be understood that the sensitivity of the detection may be increased using a sampling capacitor with a greater capacitance.

It can be noted, according to Table 2, that the status of some of the transistors M2 and M3 never changes during the execution of the sequence of steps 1 to 7 for all the pairs of electrodes. Thus, the transistors M2, except for the one connected to the port Pn+1, always remain off. The transistors M3 connected to the ports P0 to Pn−1 and Pn+1 are always off too. The circuit IOC1 may therefore be simplified by removing these components. Furthermore, combinations of commands for controlling the switches and transistors M2, M3 other than those indicated in Table 2 may enable the same results to be obtained as regards the connections of the electrodes and of the capacitor Cs between themselves, or to the ground or to the voltage sources at Vh and Vrf.

Figure 1:
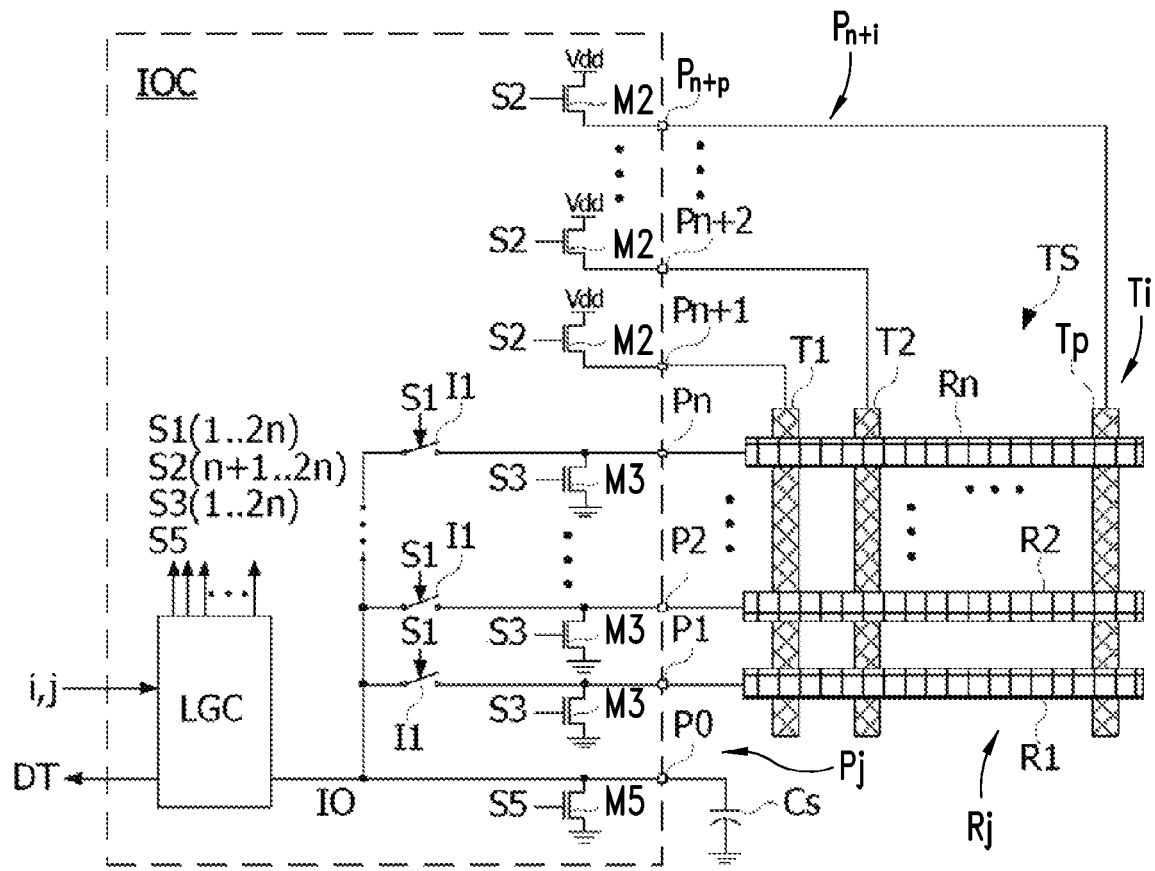
FIG. 1 described above schematically represents a touch pad and a control circuit of the touch pad, according to prior art.

Unlike the touch pad control mode described with reference to FIG. 1, the touch pad control mode described with reference to FIG. 2 makes it possible to avoid the capacitor Cs being negatively charged by the electrode Rj to which it is linked in step 3, and thus to have to measure negative voltages to locate an object on the touch pad. Indeed, such voltages cannot be measured with standard microcontrollers comprising inputs of analog-digital converters.

It shall also be noted that the number of electrodes Ti, Rj that may be connected to the circuit IOC1 depends on the pace at which the pairs of electrodes Ti, Rj can be successively analyzed in relation to a desired detection response time, given the number of cycles necessary for the voltage of the capacitor Cs to reach the threshold voltage. If more electrodes Ti, Rj must be provided, the circuit IOC1 may comprise more groups of independent ports, each group of ports connected to electrodes Rj comprising a port connected to a terminal of a respective sampling capacitor, and a terminal receiving the voltage Vrf. Furthermore, the groups of ports connected to the electrodes Ti are interconnected, a port of the groups of ports connected to electrodes Ti being connected to the other terminal of each of the sampling capacitors.

Figure 3:
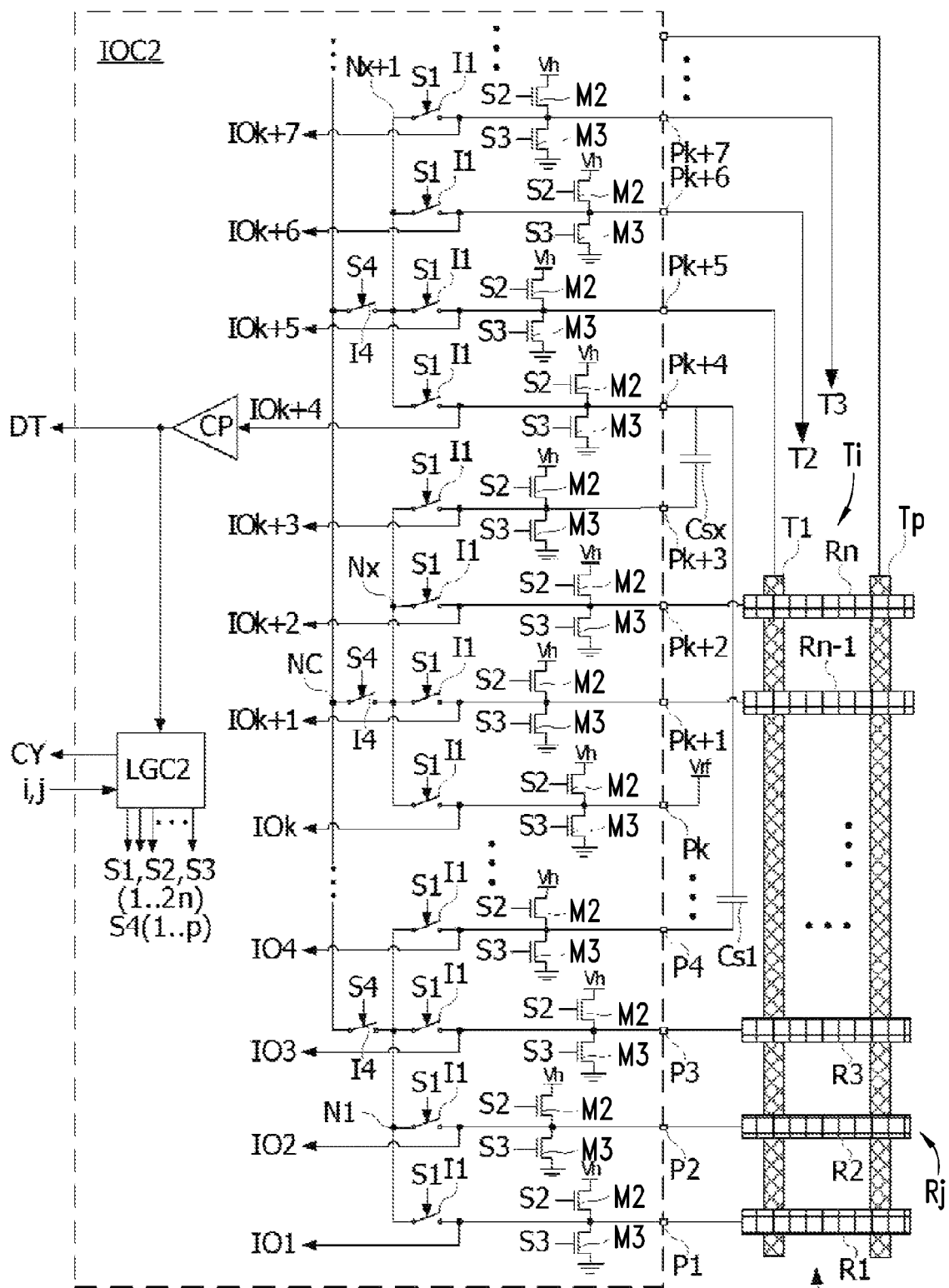
FIG. 3 represents a touch pad control circuit, according to another embodiment.

FIG. 3 represents a control circuit IOC2 of the touch pad TS, according to another embodiment. The circuit IOC2 differs from the circuit IOC1 in that the input/output ports with their respective stages are grouped together into several groups of input/output ports, each group of ports being linked to a node NC common to all the groups of ports through a respective switch 14 controlled by a control signal S4. Each port of each group of ports is connected to a node N1, ... Nx, Nx+1 common to the ports of the group of ports. In the example in FIG. 3, the circuit IOC2 comprises groups of ports P1 ... P4, Pk ... Pk+3, Pk+4 ... Pk+7, ... each comprising four ports. The switches I1 and I4 and the transistors M2, M3 of each group of ports are controlled by a logic circuit LGC2 also connected to the output of a comparator CP connected to the port Pk+4. Certain groups of ports are connected to row electrodes R1 to Rn and other groups of ports are connected to column electrodes T1 to Tp. Each group of ports connected to row electrodes Rj comprises a port P4, Pk+3 connected to a sampling capacitor Cs1 ... Csx. A port Pk of a group of ports connected to row electrodes Rj receives the reference voltage Vrf, for example the supply voltage Vh divided by two. Furthermore, a port Pk+4 of a group of ports connected to column electrodes Ti is connected to the other terminal of all the sampling capacitors Cs1 ... Csx.

In the example in FIG. 3, the ports P1 to P3 of the group of ports P1 ... P4 are connected to the row electrodes R1 to R3. The port P4 of the first group is connected to a terminal of a sampling capacitor Cs1. The ports Pk+1 and Pk+2 of the group of ports Pk ... Pk+3 are connected to the row electrodes Rn−1 and Rn. The port Pk+3 is connected to a terminal of a sampling capacitor Csx. The port Pk+4 of the group of ports Pk+4 ... Pk+7 is connected to the other terminal of the capacitor Csx. The ports Pk+5 to Pk+7 are connected to the column electrodes T1 to Tp.

The circuit IOC2 may be managed so as to activate a column electrode Ti and simultaneously analyze one row electrode Rj per group of ports connected to row electrodes. The circuit IOC2 is controlled in accordance with the sequence of steps 1 to 7 of Table 2, except that in step 3, several ports Pj−1 are active simultaneously to charge a capacitance on the pairs of electrodes comprising the active electrode Ti and the active electrodes Rj (connected to the active ports Pj−1), and in steps 1 and 5, several sampling capacitors Cs1 ... Csx are charged and discharged simultaneously. In step 7, the voltage of each of the capacitors Cs1 ... Cx is compared successively with the threshold voltage by the comparator CP by putting the other terminal of the capacitor to the ground. When all the capacitors Cs1 ... Csx have reached the threshold voltage, the sequence of steps 1 to 7 is executed with other electrodes Rj and/or another electrode Ti. Whenever the threshold voltage is reached by a capacitor, the number of cycles CY reached is stored in association with the references i, j of the corresponding pair of electrodes Ti, Rj.

According to one embodiment, the processor PRC is configured for managing the electrodes Ti, Rj also in a proximity detection mode wherein an object can be detected at a distance of several centimeters from the touch pad TS. For this purpose, the processor PRC comprises the input/output circuit IOC, IOC1 or IOC2. The processor PRC may compare the number of cycles CY supplied by the circuit LGC1 or LGC2 either with a first detection threshold defined for the mode of locating an object on the touch pad, or with a second detection threshold defined for the proximity detection mode. The first detection threshold may be adjusted to detect and locate an object, for example a finger of the user, when the object is less than a few millimeters from the touch pad. The second detection threshold may be adjusted to detect an object when the latter is at a distance in the order of a few centimeters from the touch pad. To increase the detection distance in proximity detection mode, provision can be made in this mode to use a sampling capacitor with a greater capacitance than the one used in the locate mode, the sampling capacitor having a terminal connected to a free port of the circuit IOC, IOC1, IOC2, and a terminal connected to the ground in the case of the circuit IOC, or to the sampling capacitor Cs, Cs1, Csx used in the locate mode in the case of the circuits IOC1 and IOC2.

Figure 4:
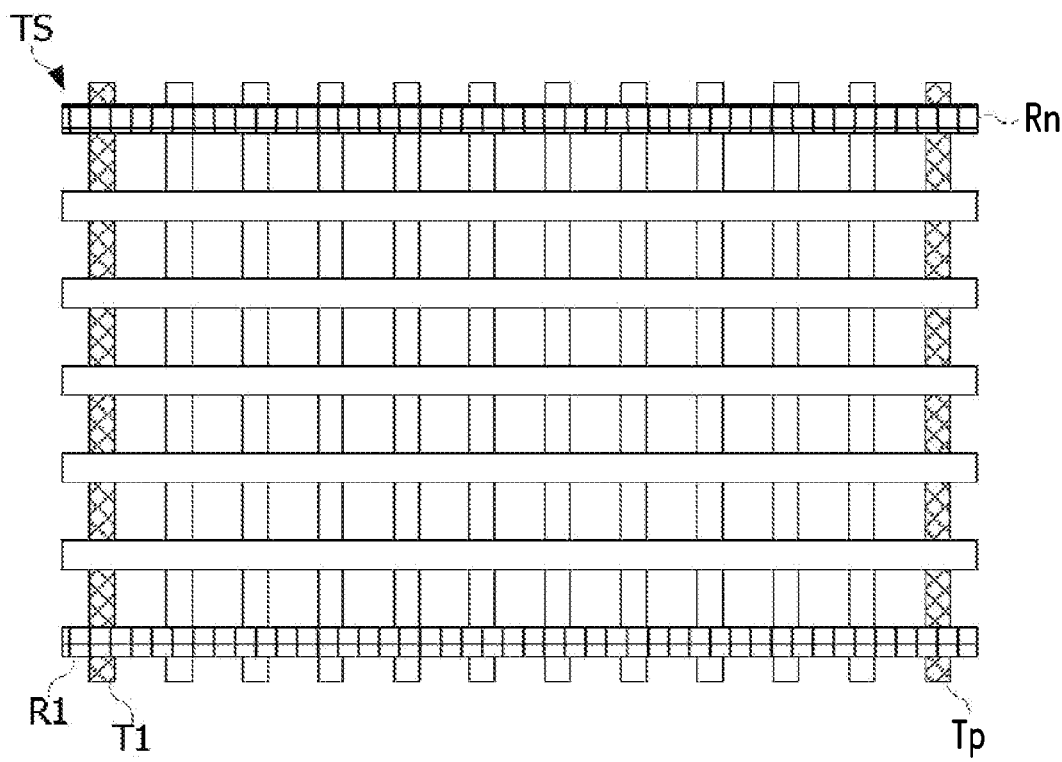
FIGS. 4 to 7 represent a touch pad, controlled in various ways to perform a proximity detection of an object.

In the proximity detection mode, several configurations of active electrodes Ti, Rj may be implemented. FIGS. 4 to 7 represent configurations of active electrodes that may be implemented to detect the proximity of an object. On these figures, the electrodes controlled as a sending electrode (column Pn+i of Table 2) are represented with a double oblique hatch pattern, and the electrodes controlled as a receiving electrode (column Pj−1 of Table 2) are represented with a double horizontal and vertical hatch pattern. Thus, FIG. 4 represents the touch pad TS controlled in proximity detection mode in which the electrodes on the edges of the touch pad, i.e., the first and last row electrodes R1, Rn and column electrodes T1, Tp, are activated simultaneously, to exchange electric charges from the capacitance on the electrodes with the sampling capacitor Cs. The circuits in FIGS. 2 and 3 allow this control mode, because different switch units I1, M2, M3 are provided for each of the ports of the circuit IOC1 or IOC2. Indeed, Table 2 may be executed simultaneously with two row electrodes (ports Pj−1) and two column electrodes (ports Pn+i). The proximity detection may also be performed in two successive acquisitions, each of the two acquisitions being performed with a single one of the two electrodes T1, Tp active and the two electrodes Rj active simultaneously. The proximity detection can also be performed in four successive acquisitions, with one acquisition per pair of electrodes used in the proximity detection mode. In the event of several successive acquisitions, the presence of an object near the touch pad may be determined for example by adding the measurements obtained and by comparing the result of the addition with the proximity detection threshold, or by comparing each measurement with the proximity detection threshold.

Figure 5:
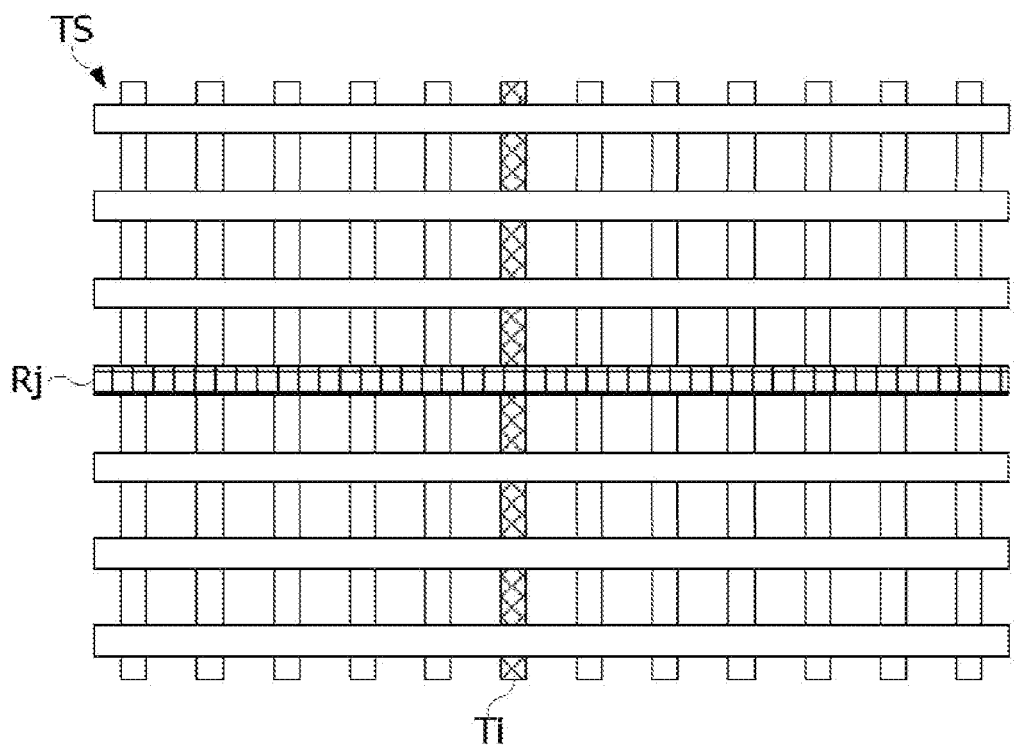

In FIG. 5, only one row electrode Rj and one column electrode Ti are activated. The overlapping area of the activated electrodes Rj and Ti may be substantially in the center of the touch pad TS. In this configuration, the control mode of the circuit IOC1, IOC2 corresponds to the one indicated in Table 2. The proximity detection is then performed by activating the two electrodes Ti and Rj and by selecting the proximity detection threshold applied to the number of cycles CY. In this proximity detection configuration, the detection distance is greater in the vicinity of the corners of the touch pad TS than in the vicinity of the center of the latter.

Figure 6:
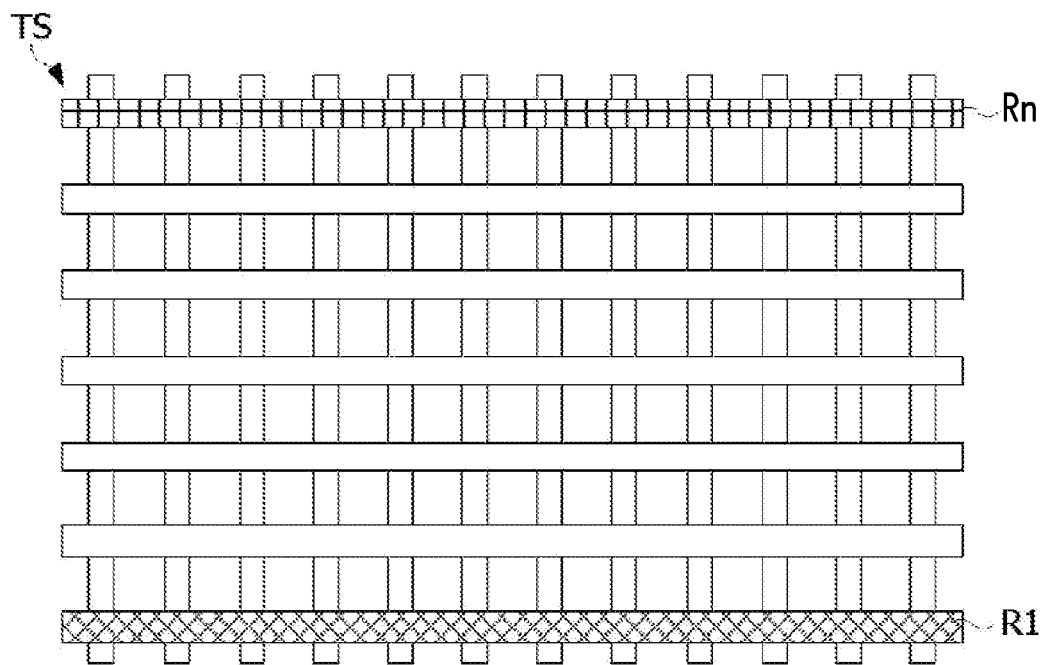

In FIG. 6, only the first and the last row electrodes R1 and Rn (or column electrodes) are activated. In this configuration, one of the two activated electrodes R1 is controlled like a sending electrode in accordance with the columns Pn+i of Table 2, and the other one of the two activated electrodes Rn is controlled like a receiving electrode, in accordance with the columns Pj−1 of Table 2. This configuration is permitted by the circuit IOC2 in FIG. 3, thanks to the use of the switches I4, enabling a group of row electrodes Rj to be connected to the groups of sending electrodes connected to the ports Pk+5 to Pk+7. It will be understood that it is also possible to activate only the first and last column electrodes T1 and Tp and to control one of these two electrodes as receiving electrode. For this purpose, it is sufficient, thanks to the switches I4, not to link the group of row electrodes of the electrode to be controlled as receiving electrode to the group of ports Pk+4 to Pk+7, and to control this electrode in accordance with the columns Pj−1 of Table 2.

Figure 7:
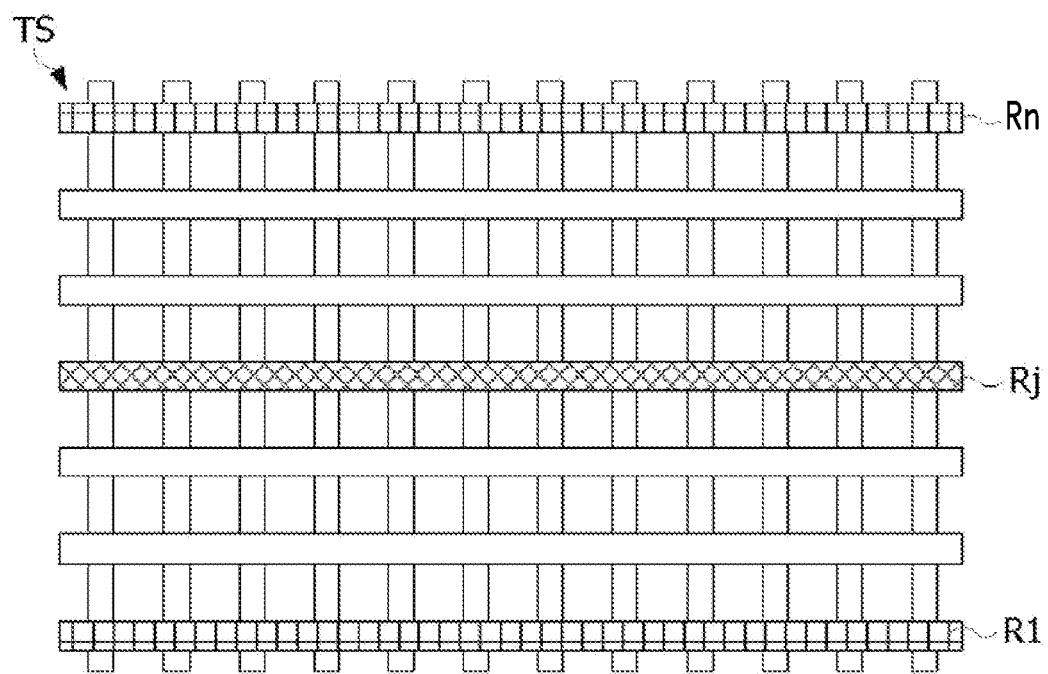

In FIG. 7, only the first and the last row electrode R1 and Rn are controlled, as well as the central row electrode Rj (passing substantially through the center of the touch pad). In this configuration, the central electrode Rj is controlled to operate like a sending electrode, in accordance with the column Pn+j of Table 2, and the other two activated electrodes R1 and Rn are controlled simultaneously to operate like receiving electrodes, in accordance with the column Pj−1 of Table 2. This configuration is permitted by the circuit IOC2 in FIG. 3, thanks to the use of the switches I4, enabling the group of row electrodes comprising the electrode Rj to be connected to the groups of sending electrodes connected to the ports Pk+5 to Pk+7. Compared to the configuration in FIG. 6, the configuration in FIG. 7 has a lower sensitivity, but a higher immunity to noise.

It will be understood by those skilled in the art that various alternative embodiments and various applications of the present disclosure are possible. In particular, the proximity detection mode may be implemented indifferently by one or other of the input/output circuits IOC, IOC1, IOC2, or more generally by a circuit for managing a touch pad implementing a detection method based on capacitance measurements of pairs of electrodes. Furthermore, whether it be in locate mode or in proximity detection mode, a measurement representative of the capacitance on one or more pairs of electrodes of the touch pad may be determined indifferently by executing a fixed number of charge and charge transfer cycles and by measuring the voltage at a terminal of the sampling capacitor after executing the fixed number of cycles, or by executing charge and charge transfer cycles until the voltage at a terminal of the sampling capacitor reaches a threshold voltage, and by using the number of cycles executed.

The values of the voltages supplied to the terminals of the sampling capacitor and to the electrodes are only given as an example, and may vary as long as the following condition is met: Vh>Vrf>0. It is not necessary either to link the electrodes and the sampling capacitor to the ground in steps 3 and 7. The ground voltage applied in steps 3 and 7 may be replaced with a positive and non-zero voltage lower than the voltage Vrf. Furthermore, in the proximity detection mode for example, the voltage Vh may be greater than the voltage of the circuit so as to increase the detection distance.

Furthermore, the locate mode described with reference to FIGS. 2 and 3 is independent of the implementation of a proximity detection mode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
controlling a touch pad having a plurality of row electrodes transverse to a plurality of column electrodes, the controlling including:
executing an object locate mode, the executing of the object locate mode including:
determining a plurality of first capacitances between a plurality of pairs of electrodes, each pair of electrodes including one of the row electrodes that overlaps one of the column electrodes;
determining a presence of an object within a first distance of the touch pad by comparing each of the first capacitances with a first detection threshold; and
determining a position of the object with respect to the touch pad by analyzing the first capacitances;
executing a proximity detection mode, the executing of the proximity detection mode including:
determining a second capacitance between a first electrode and a second electrode of the touch pad, the first electrode being one of the row electrodes positioned at an edge of the touch pad and the second electrode being one of the column electrodes positioned at the edge of the touch pad;
determining a third capacitance between the second electrode and a third electrode that is one of the row electrodes at opposite edge of the touch pad from the first electrode and a fourth capacitance between the third electrode and a fourth electrode that is one of the column electrodes at an opposite edge of the touch pad from the second electrode, and a fifth capacitance between the first electrode and the fourth electrode; and
determining the presence of the object within a second distance of the touch pad by comparing the second capacitance with a second detection threshold, the second threshold being different from the first detection threshold.

2. The method according to claim 1 wherein the second detection threshold is larger than the first detection threshold.

3. The method according to claim 1, wherein the determining of the second, third, fourth, and fifth capacitance is performed concurrently.

4. The method according to claim 1, wherein the determining the second, third, fourth, and fifth capacitance is performed sequentially.

5. The method according to claim 1, wherein the determining of the first capacitances of the pairs of electrodes of the touch pad includes:
   executing a first number of cycles of charging the capacitances on the pairs of electrodes and transferring the charge from the capacitances on the pairs of electrodes to a sampling capacitor; and
   determining the first capacitances on the pairs of electrodes by analyzing the first number of cycles of charging and transferring so that a voltage at a terminal of the sampling capacitor exceeds a threshold voltage.

6. The method according to claim 1, wherein the determining of the first capacitances of the pairs of electrodes of the touch pad includes:
   executing a first number of cycles of charging the capacitances on the pairs of electrodes and transferring the charge from the capacitances on the pairs of electrodes to a sampling capacitor;
   determining the first capacitances on the pairs of electrodes by analyzing a voltage at a terminal of the sampling capacitor, after the first number of cycles of charging and transferring.

7. The method according to claim 1, wherein the determining of the first capacitances on the plurality of pairs of electrodes of the touch pad includes:
   applying a first voltage to a first terminal of a sampling capacitor and a second voltage to a second terminal of the sampling capacitor, the second voltage being in between the first voltage and a third voltage that is greater than or equal to a ground voltage;
   applying the third voltage to a first electrode of the pairs of electrodes, and the second voltage to the second electrode of the pairs of electrodes;
   transferring electric charges between the first and second electrodes of the pairs of electrodes and the sampling capacitor by coupling the first electrode to the first terminal of the sampling capacitor and coupling the second voltage to the second electrode and to the second terminal of the sampling capacitor;
   executing a first number of cycles of the applying and transferring; and
   after executing the first number of cycles determining the first capacitances between the first and the second electrode of the pairs of electrodes as a function of the voltage at the first terminal of the sampling capacitor, the second terminal receiving the third voltage.

8. The method according to claim 7, wherein the first voltage is equal to a supply voltage and the second voltage is in the order of the first voltage divided by two, and the third voltage is equal to the ground voltage.

9. The method according to claim 7, wherein the proximity detection mode uses a sampling capacitor having a higher capacitance than that of the sampling capacitor used in the object locate mode.

10. The method according to claim 1, wherein the determining the first capacitances on the plurality of pairs of electrodes of the touch pad includes:
    applying a first voltage to a first terminal of a sampling capacitor and a second intermediate voltage to a second terminal of the sampling capacitor, the second intermediate voltage being in between the first voltage and a third voltage that is greater than or equal to a ground voltage;
    applying the third voltage to a first electrode of the pairs of electrodes, and the second voltage to the second electrode of the pairs of electrodes;
    transferring electric charges between the first and second electrodes of the pairs of electrodes and the sampling capacitor by coupling the first electrode to the first terminal of the sampling capacitor and coupling the second voltage to the second electrode and to the second terminal of the sampling capacitor;
    executing a first number of cycles of the applying and transferring; and
    determining the first capacitances on the pairs of electrodes by determining the first number of cycles executed so that a voltage at the first terminal of the sampling capacitor reaches a threshold voltage.

11. A device, comprising:
    a touch pad, having a plurality of electrodes disposed in rows and in columns that are transverse to the rows;
    an object detection circuit configured to manage the touch pad, the detection circuit being configured to operate in an object locate mode and a proximity detection mode, wherein:
    the object detection circuit is configured in the object locate mode to:
    determine a plurality of first capacitances on each of a plurality of pairs of electrodes of the touch pad, each pair of electrodes having a row electrode and a column electrode;
    compare the first capacitances with a first detection threshold, the first detection threshold configured to detect a presence of an object within a first distance of the touch pad; and
    determine a position of the object with respect to the touch pad based on the first capacitances that detected the presence of the object;
    the object detection circuit is configured in the proximity detection mode to:
    determine a second capacitance between a first electrode and a second electrode of the touch pad, the first electrode being one of the row electrodes positioned at an edge of the touch pad and the second electrode being one of the column electrodes positioned at the edge of the touch pad;
    determine a third capacitance between the second electrode and a third electrode that is one of the row electrodes at opposite edge of the touch pad from the first electrode and a fourth capacitance between the third electrode and a fourth electrode that is one of the column electrodes at an opposite edge of the touch pad from the second electrode, and a fifth capacitance between the first electrode and the fourth electrode; and
    compare the second capacitance with a second detection threshold, the second detection threshold configured to detect the presence of the object within a second distance of the touch pad the second detection threshold being different from the first detection threshold.

12. The device according to claim 11, wherein the detection circuit in the proximity detection mode is configured to determine the second, third, fourth, and fifth capacitances sequentially.

13. The device according to claim 11, wherein the detection circuit in the object locate mode is configured to:

generate a charge on the pairs of electrodes and transfer the charge from the pairs of electrodes to a sampling capacitor for a first number of cycles; and determine the first capacitances of the pairs of electrodes to determine the presence of the object based on a first terminal of the sampling capacitor reaching the first detection threshold.

14. The device according to claim 13, wherein the detection circuit in the object locate mode is configured to:

apply a first voltage to the first terminal of the sampling capacitor and a second voltage to a second terminal of the sampling capacitor, the second voltage being in between the first voltage and a third voltage greater than or equal to a ground voltage;

apply the third voltage to a first electrode of one of the pairs of electrodes and the second voltage to a second electrode of one of the pairs of electrodes;

couple the first electrode of one of the pairs of electrodes to the first terminal of the sampling capacitor and couple the second electrode of one of the pairs of electrodes to the second terminal of the sampling capacitor, to transfer the charges between the first and second electrodes and the sampling capacitor;

execute the first number of cycles that apply and couple; and after the first number of cycles, determine the first capacitances between the first electrode and the second electrode as a function of the voltage at the first terminal of the sampling capacitor and the second terminal.

15. The device according to claim 14, wherein the first voltage is equal to a supply voltage and the second voltage is in the order of the first voltage divided by two, and the third voltage is equal to the ground voltage.

16. The device according to claim 14, wherein the proximity detection mode is configured to use a second sampling capacitor having a higher capacitance than that of the sampling capacitor used in the object locate mode.

17. The device according to claim 11, further comprising:
a sampling capacitor having a first terminal and a second terminal;
a power port;
a first switch unit;
a second switch unit;
a third switch unit;
an input/output circuit that includes:
    a first port coupled to the first terminal of the sampling capacitor, the second terminal of the sampling capacitor being coupled ground;
    a first group of ports each coupled to one of the row electrodes of the touch pad, coupled to the first port through the first switch unit, and coupled to the ground through the second switch unit;
    a second group of ports each coupled to one of the column electrodes of the touch pad and each coupled to the power port through the third switch unit; and
    a control circuit configured to control the first, second and third switch units and to determine from a voltage at the first terminal of the sampling capacitor, the first capacitances of the pairs of electrodes a first electrode of the pair coupled to one of the ports of the first group of ports and a second electrode of the pair coupled to one of the ports of the second group of ports.

18. The device according to claim 11, further comprising:
a power port;
an input/output circuit that includes:
a plurality of switch units;
a sampling capacitor;
a control circuit configured to control the switch units and to determine, with voltage measurements at a first terminal of the sampling capacitor, the first capacitances of the pairs of electrodes;
a first group of ports that include:
    a first port configured to receive a voltage lower than a supply voltage;
    a plurality of second ports each coupled to one of the electrodes of the touch pad; and
    a third port coupled to the first terminal of the sampling capacitor and coupled to the ground through one of the switch units;
a second group of ports that include:
    a first port coupled to a second terminal of the sampling capacitor and coupled to the power port through one of the switch units;
    a plurality of second ports each coupled to one of the electrodes of the touch pad and each coupled to the ground through one of the switch units; and
a node common coupled to the first and second groups of ports through respective ones of the switch units and the control circuit, a first electrode of the pair of electrodes being coupled to one of the ports of the first group of ports and the second electrode being coupled to one of the ports of the second group of ports.

19. The device according to claim 18, further comprising:
a second sampling capacitor;
wherein the input/output circuit includes at least three groups of ports each coupled to the common node through a respective one of the switch units controlled by the control circuit, one port of one of the groups of ports being coupled to a first terminal of the second sampling capacitor, a second terminal of the second sampling capacitor being coupled to a port of another respective group of ports.

20. The device according to claim 19, wherein the control circuit is configured to control the switch units so as to execute the first number of cycles to generate a charge between the pairs of electrodes and to transfer the charge between the pairs of electrodes and the sampling capacitor, and to compare with a threshold the voltage at the first terminal of the sampling capacitor until the compared voltage reaches the threshold, the first capacitances to be measured being determined according to the first number of cycles executed.

21. The device according to claim 19, wherein the control circuit is configured to control the switch units so as to execute the first number of cycles to generate a charge on the pairs of electrodes and to transfer the charge between the pairs of electrodes and the sampling capacitor, and to measure the voltage at a terminal of the sampling capacitor, the first capacitances being determined according to the voltage measured.

22. A processor, comprising:
a device configured to manage a touch pad that has a plurality of electrodes disposed in rows and in columns transverse to the rows, the device being configured to operate in an object locate mode and a proximity detection mode, wherein:
the device is configured in the object locate mode to:
    determine a plurality of first capacitances of each of a plurality of pairs of electrodes of the touch pad, each pair of electrodes having a row electrode and a column electrode;
    compare each first capacitance with a first detection threshold configured to detect a presence of an object within a first distance of the touch pad; and determine position of the object with respect to the touch pad from the first capacitances;

the device is configured in the proximity detection mode to:
- determine a second capacitance between a first electrode and a second electrode of the touch pad; and
- compare the second capacitance with a second detection threshold that is different from the first detection threshold to determine a presence of the object within a second distance of the touch pad; and wherein the device is further configured in the object locate mode to:
- apply a first voltage to a first terminal of a sampling capacitor and a second intermediate voltage to a second terminal of the sampling capacitor, the second voltage being in between the first voltage and a third voltage greater than or equal to a ground voltage;
- apply the third voltage to a first electrode of the pairs of electrodes, and the second voltage to the second electrode of the pairs of electrodes;
- couple the first electrode to the first terminal of the sampling capacitor and couple the second voltage to the second electrode and to the second terminal of the sampling capacitor, to transfer charges between the first and second electrodes and the sampling capacitor; and
- execute a first number of cycles to apply and coupler and after the first number of cycles, determine the first capacitance between the first and the second electrode as a function of a voltage at the first terminal of the sampling capacitor and the second terminal of which receives the third voltage.

23. The processor according to claim 22, wherein the first electrode is one of the row electrodes and the second electrode is one of the column electrodes.

24. The processor according to claim 22, wherein the first and second electrodes are parallel electrodes at opposite edges of the touch pad.

25. The processor according to claim 22, wherein the device is configured in the object locate mode to:
- execute the first number of cycles generate a charge on the pairs of electrodes and transfer the charge from the pairs of electrodes to the sampling capacitor; and
- determine the first capacitances on the pairs of electrodes according to the first number of cycles, so that a voltage at the first terminal of the sampling capacitor reaches a threshold voltage.

26. The processor according to claim 22, further comprising:
- a power port;
- an input/output circuit, that includes:
  - a first switch unit;
  - a second switch unit;
  - a third switch unit;
  - a first port coupled to the first terminal of the sampling capacitor, the second terminal of which is coupled to the ground voltage;
  - a first group of ports each coupled to a respective one of the electrodes of the touch pad, coupled to the first port through the first switch unit and coupled to the ground voltage through the second switch unit;
  - a second group of ports each coupled to a respective one of the electrodes of the touch pad and each coupled to the power port of the input/output circuit through the third switch unit, and
  - a control circuit configured to control the first, second, and third switch units and to determine, with voltage measurements at the first terminal of the sampling capacitor, the first capacitances on the pairs of electrodes wherein a first electrode of the pairs of electrodes is coupled to a port of the first group of ports and a second electrode of the pairs of electrodes is coupled to a port of the second group of ports.

27. The processor according to claim 26, wherein the control circuit is configured to control the switch units so as to execute the first number of cycles to generate the charge on the pairs of electrodes and transfer the charge between the pairs of electrodes to the sampling capacitor, and of compare with a threshold the voltage at a terminal of the sampling capacitor until the compared voltage reaches the threshold, the first capacitance to be measured being determined according to the first number of cycles executed.

28. The processor according to claim 26, wherein the control circuit is configured to control the switch units so as to execute the first number of cycles to generate the charge on the pairs of electrodes, and transfer the charge between the pairs of electrodes to the sampling capacitor, and to measure the voltage at a terminal of the sampling capacitor, the first capacitance to be measured being determined according to the voltage measured.

29. The processor according to claim 22, further comprising:
- a power port;
- an input/output circuit that includes:
  - a first switch unit;
  - a second switch unit;
  - a third switch unit;
  - a fourth switch unit;
  - a control circuit configured to control the switch units and to determine, using voltage measurements at the first terminal of the sampling capacitor, the first capacitance of the pairs of electrodes;
  - a first group of ports that include:
    - a first port configured to receive a voltage lower than a supply voltage;
    - a plurality of second ports each coupled to one of the electrodes of the touch pad; and
    - a third port coupled to the first terminal of the sampling capacitor and coupled to the ground through the first switch unit;
  - a second group of ports that include:
    - a first port connected to the second terminal of the sampling capacitor and coupled to the power port through the second switch unit;
    - a plurality of second ports each coupled to one of the electrodes of the touch pad and each coupled to the ground through the third switch unit; and
    - a node common to the first and second group of ports through the fourth switch unit, and the control circuit; and wherein
  - a first electrode of the pairs of electrodes being coupled to a port of the first group of ports and a second electrode of the pairs of electrodes being coupled to a port of the second group of ports.

30. The processor according to claim 29, wherein the input/output circuit comprises third group of ports coupled to the common node through a fifth switch unit controlled by the control circuit, one port from the first, second, and third group of ports being coupled to a terminal of several sampling capacitors, another terminal of each sampling capacitor being coupled to a port from one of the other groups of ports.

31. A method, comprising:
- controlling a touch pad having a plurality of row electrodes transverse to a plurality of column electrodes, the controlling including:

executing an object locate mode, the executing of the object locate mode including:
- determining a plurality of first capacitances between a plurality of pairs of electrodes, each pair of electrodes including one of the row electrodes that overlaps one of the column electrodes;
- determining a presence of an object within a first distance of the touch pad by comparing each of the first capacitances with a first detection threshold; and determining a position of the object with respect to the touch pad by analyzing the first capacitances;

executing a proximity detection mode, the executing of the proximity detection mode including:
- determining a second capacitance using only a first one of the row electrodes and a second one of the row electrodes of the touch pad, the first one of the row electrodes being at an edge of the touch pad, the second one of the row electrodes being at a center of the touch pad wherein the first one of the row electrodes is not adjacent to the second one of the row electrodes; and
- determining the presence of the object within a second distance of the touch pad by comparing the second capacitance with a second detection threshold, the second threshold being different from the first detection threshold.

32. The method of claim 31, further comprising a third electrode that is one of the row electrodes at an opposite edge of the touch pad from the first electrode and the executing of the proximity detection mode includes determining a third capacitance between the second electrode and a third electrode.

* * * * *

UNITED STATES PATENT AND TRADEMARK OFFICE
CERTIFICATE OF CORRECTION

| | | |
|---|---|---|
| PATENT NO. | : 8,704,797 B2 | Page 1 of 1 |
| APPLICATION NO. | : 13/309284 | |
| DATED | : April 22, 2014 | |
| INVENTOR(S) | : Laurent Beyly et al. | |

It is certified that error appears in the above-identified patent and that said Letters Patent is hereby corrected as shown below:

In the Claims

Column 17, Line 26:
"execute a first number of cycles to apply and coupler and" should read, --execute a first number of cycles to apply and couple; and--.

Signed and Sealed this
Twenty-fifth Day of November, 2014

Michelle K. Lee
*Deputy Director of the United States Patent and Trademark Office*